(12) United States Patent
Mann et al.

(10) Patent No.: US 9,316,918 B2
(45) Date of Patent: Apr. 19, 2016

(54) EUV COLLECTOR

(71) Applicant: Carl Zeiss SMT GmbH, Oberkochen (DE)

(72) Inventors: Hans-Juergen Mann, Oberkochen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 424 days.

(21) Appl. No.: 13/626,330

(22) Filed: Sep. 25, 2012

(65) Prior Publication Data

US 2013/0027681 A1   Jan. 31, 2013

Related U.S. Application Data

(63) Continuation of application No. PCT/EP2011/056922, filed on May 2, 2011.

(30) Foreign Application Priority Data

May 6, 2010  (DE) .......................... 10 2010 028 655

(51) Int. Cl.
*G03B 27/54* (2006.01)
*G03B 27/72* (2006.01)
(Continued)

(52) U.S. Cl.
CPC .......... *G03F 7/70175* (2013.01); *G03F 7/7005* (2013.01); *G03F 7/70166* (2013.01); *G21K 1/067* (2013.01); *G21K 2201/067* (2013.01)

(58) Field of Classification Search
CPC  G03F 7/7005; G03F 7/70166; G03F 7/70175

USPC .................... 355/52, 53, 55, 67–71
See application file for complete search history.

(56) References Cited

U.S. PATENT DOCUMENTS 6,320,182 B1 * 11/2001 Hubble et al. ................ 250/216
7,075,712 B2   7/2006 Kinoshita et al.
7,075,713 B2   7/2006 Arenberg
(Continued)

FOREIGN PATENT DOCUMENTS

EP    1 469 349 A1   10/2004
JP    2002-189169 A   7/2002
(Continued)

OTHER PUBLICATIONS

Wolter "Spiegelsysteme streifenden Einfalls als abbildende Optiken für Röntgenstrahlen," Annalen der Physik, vol. 10, p. 94-114, (with English translation of contents).
(Continued)

*Primary Examiner* — Hung Henry Nguyen
(74) *Attorney, Agent, or Firm* — Fish & Richardson P.C.

(57) ABSTRACT

A collector transfers an emission of an EUV radiation source to a main intensity spot. The collector has at least one collector subunit including at least one grazing incidence mirror. The grazing incidence mirror transfers EUV radiation from the radiation source to an intensity spot. At least one ellipsoid mirror of the collector has an ellipsoidal mirror surface. The ellipsoidal mirror surface is impinged by an angle of incidence above a critical grazing incidence angle. No more than one collector subunit is arranged in the beam path of an EUV radiation source between a position of the EUV radiation source and the intensity spot. At least some of the EUV rays are only reflected in a grazing manner.

19 Claims, 5 Drawing Sheets

(51) Int. Cl.
  *G03F 7/20* (2006.01)
  *G21K 1/06* (2006.01)

(56) References Cited

U.S. PATENT DOCUMENTS

| | | | |
|---|---|---|---|
| 7,148,952 B2 * | 12/2006 | Eurlings et al. | 355/53 |
| 7,501,641 B2 | 3/2009 | Silverman et al. | |
| 7,527,390 B2 * | 5/2009 | Kakuta | 362/247 |
| 8,390,785 B2 * | 3/2013 | Zocchi et al. | 355/67 |
| 8,411,815 B2 * | 4/2013 | Wallhead et al. | 378/34 |
| 2002/0014598 A1 | 2/2002 | Melnychuk et al. | |
| 2002/0113954 A1 | 8/2002 | Antoni et al. | |
| 2003/0043455 A1 | 3/2003 | Singer et al. | |
| 2004/0223531 A1 | 11/2004 | Arenberg | |
| 2004/0256575 A1 | 12/2004 | Singer et al. | |
| 2005/0253091 A1 | 11/2005 | Kurt et al. | |
| 2006/0039435 A1 | 2/2006 | Cheymol et al. | |
| 2006/0120429 A1 | 6/2006 | Murakami | |
| 2006/0176547 A1 | 8/2006 | Sasian | |
| 2008/0179548 A1 | 7/2008 | Bykanov et al. | |
| 2008/0266650 A1 | 10/2008 | Sasian | |
| 2009/0244696 A1 | 10/2009 | Geyl et al. | |
| 2010/0284511 A1 | 11/2010 | Zocchi et al. | |

FOREIGN PATENT DOCUMENTS

| | | |
|---|---|---|
| JP | 2004-501491 A | 1/2004 |
| JP | 2004-333475 A | 11/2004 |
| JP | 2005-501221 A | 1/2005 |
| JP | 2005-522026 A | 7/2005 |
| JP | 2005-328058 A | 11/2005 |
| JP | 2007-298980 A | 11/2007 |
| JP | 2008-503078 A | 1/2008 |
| JP | 2009-532891 A | 9/2009 |
| JP | 2010-519783 A | 6/2010 |
| JP | 2010-261951 A | 11/2010 |
| WO | WO 01/99143 | 12/2001 |
| WO | WO 2004/092693 A2 | 10/2004 |
| WO | WO 2009/095220 | 8/2009 |

OTHER PUBLICATIONS

Wolter, "Verallgemeinerte Schwarzschildsche Spiegelsysteme streifender Reflexion als Optiken für Röntgenstrahlen," Annalen der Physik, p. 286-295, 1952, (with English translation of contents).

Internet p. http://www.x-ray-optics.de (see keywords "Types of Optics", "Reflecting optics" and "Curved mirrors").

The German Examination Report, with English translation, for corresponding DE Appl No. 10 2010 028 655.9, dated Oct. 14, 2010.

International Search Report for corresponding PCT Appl No. PCT/EP2011/056922, dated Oct. 6, 2011.

Japanese office action, with English translation thereof, for JP Appl No. 2013-508449, dated Jan. 28, 2015.

* cited by examiner

EUV COLLECTOR

CROSS-REFERENCE TO RELATED APPLICATIONS

This application is a continuation of, and claims priority under 35 USC 120 to, international application PCT/EP2011/056922, filed May 2, 2011, which claims benefit under 35 USC 119 of German Application No. 10 2010 028 655.9, filed May 6, 2010. International application PCT/EP2011/056922 is hereby incorporated by reference in its entirety.

FIELD

The disclosure relates to a collector for transferring an emission of an EUV (extreme ultraviolet) light source to a main intensity spot. The disclosure also relates to an illumination optics including a such collector, an illumination system including such an illumination optics, a projection exposure apparatus including such an illumination system, a method for producing a microstructured or nanostructured component using a such projection exposure apparatus, and a component produced by such a method.

BACKGROUND

EUV collectors are disclosed in U.S. Pat. No. 7,075,712 B2; U.S. Pat. No. 7,501,641 B2; US 2006/0176547 A1; US 2006/0120429 A1; U.S. Pat. No. 7,075,713 B2; EP 1 469 349 A1; US 2008/0266650 A1 and WO 2009/095220 A1.

SUMMARY

The disclosure seeks to provide an optimally sized collectable solid angle of the EUV light source while ensuring a given amount of constructional effort for the collector.

Applicants realized that the advantages of a collector subunit including at least one grazing incidence mirror can be combined with those of an ellipsoid mirror for increasing the collectable solid angle of a non-directional EUV radiation source. If a collector subunit is mentioned in the following description, reference is always made to a collector subunit including at least one grazing incidence mirror. The collector subunit is able to collect solid angle regions of the EUV radiation emitted by the radiation source which are directed in the forward direction, in other words in the direction of the main intensity spot. Correspondingly, the at least one ellipsoid mirror is able to collect EUV radiation emitted in the backward direction. The collected solid angle regions may advantageously be combined to form a collected entire solid angle which is greater than 2π, such as greater than 2.5π, greater than 3π or greater than 3.5π. The at least one collector subunit may include at least one grazing incidence mirror which is designed in the manner of a mirror shell. The mirror shell may be rotationally symmetric about an axis. The collector subunit may include several grazing incidence mirrors, for example two, three, four, five or even more grazing incidence mirrors. These grazing incidence mirrors may be mirror shells which are rotationally symmetric about an axis. The transfer intensity spot to which the EUV radiation from the radiation source is transferred by the collector subunit including the at least one grazing incidence mirror may be a main intensity spot. Alternatively, the transfer intensity spot may be an intermediate intensity spot which may be transferred to the main intensity spot via another optical system. The main intensity spot is the intensity spot which allows the EUV radiation to be transferred on via an illumination optics in order to illuminate a target object. The emission of the EUV radiation source may be non-directional, in other words it may be emitted substantially isotropically in all spatial directions. The critical grazing incidence angle is 70°. In other words, the EUV radiation is reflected by the at least one grazing incidence mirror of the collector subunit at an angle of incidence which is at least 70°. The ellipsoid mirror is impinged by the emission of the EUV radiation source at an angle of incidence which is smaller than 70°. Each EUV partial beam is reflected by no more than one collector subunit including at least one grazing incidence mirror, which ensures that the solid angle regions collected by these collector subunits are collected in a particularly efficient manner. As it is common practice in optics, the angle of incidence is defined as the angle between a normal to a reflection plane and the incident radiation. The at least one collector subunit including the at least one grazing incidence mirror may include grazing incidence mirrors which are designed in such a way that the EUV radiation from the radiation source is transferred to the transfer intensity spot via two reflections occurring one after the other at the respective grazing incidence mirror. The at least one collector subunit including the at least one grazing incidence mirror may include two grazing incidence mirrors which are arranged one behind the other. The at least one collector subunit including at least one grazing incidence mirror may be a Wolter collector subunit. The collector subunit may be designed as a collector of the type Wolter-I or as a collector of the type Wolter-II.

A collector including exactly one collector subunit may in particular be achieved by combining an already known design of a collector including at least one grazing incidence mirror with an additional ellipsoid mirror.

A collector including exactly two collector subunits may be used to increase the solid angle collectable one of the two collector subunits. In particular, this collector allows solid angle regions of the emission of the non-directional EUV radiation source to be collected in the forward direction towards the main intensity spot on the one hand and in the backward direction on the other.

Alternatively, a collector including exactly two collector subunits can be used to collect the emission of two spaced EUV radiation sources by one and the same collector.

In some embodiments, at least one collector subunit may be used to interact with another, downstream collector subunit or a downstream ellipsoid mirror. The intermediate intensity spot of the collector may also be used as a spatial filter for eliminating unwanted emissions of the EUV radiation source which have wavelengths different from a useful wavelength range. There may be provided at least two collector subunits which transfer the EUV radiation from the radiation source to two intermediate intensity spots which are spaced from each other. The two collector subunits which transfer the EUV radiation from the radiation source to the intermediate intensity spots may be rotationally symmetric about in each case one symmetry axis. The two symmetry axes of the at least two collector subunits which transfer the EUV radiation from the radiation source to the intermediate intensity spots may be arranged in such a way as to not coincide with each other.

In certain embodiments, a beam path prevents an excessive number of reflections of the EUV radiation within the collector. Within a collector of this type, the EUV partial beam may either be reflected by the ellipsoid mirror first before being reflected by the collector subunit including at least one grazing incidence mirror or, vice versa, by this collector subunit first before being reflected by the ellipsoid mirror.

In some embodiments, an arrangement results in a compact design on the one hand and allow large solid angles of the emission of the non-directional EUV radiation source to be collected on the other. Radiation which is transmitted from an ellipsoid mirror of these arrangements to the main intensity spot directly is reflected by no collector subunit after being reflected by the respective ellipsoid mirror. A combination of these arrangements where EUV radiation is transferred to the main intensity spot via a through-opening in the collector subunit on the one hand and via a spatial region on the other which is arranged around the collector subunit is conceivable as well.

In certain embodiments, an arrangement of a plurality of collector subunits ensures an efficient transfer of the emission of the EUV radiation source while allowing a large solid angle region to be utilized. The collector subunits may be arranged around the EUV radiation source in the form of a regular polyhedron or in the form of an irregular polyhedron. The arrangement of the collector subunits around the EUV radiation source may be such that particular solid angle regions are omitted, thus allowing a plasma-producing laser radiation to be supplied or an installation space to be provided for at least one retaining device.

In some embodiments, a collector including two types of collector subunits which differ in that whether the outer or inner wall of a mirror shell reflects the EUV radiation, may use one type of the collector subunit for smaller solid angles for direct forward transfer towards the main intensity spot and the other type of the collector subunit for larger angles. The two collector subunits of this design may in particular be mirror shells or mirror shell groups which are arranged (nested) one inside the other. Such an arrangement of collector subunits may be combined with at least one ellipsoid mirror or with an arrangement of several ellipsoid mirrors according to the embodiments described above.

In general, as disclosed herein, the advantages of collector disclosed herein are correspondingly applicable to an illumination optics, an illumination system, a projection exposure apparatus, a production method and a component, as disclosed herein. The EUV radiation source may be an LPP source. The EUV collector may be designed in such a way that the emission of several EUV radiation sources is transferred to one main intensity spot. Correspondingly, the illumination system may include more than one EUV radiation source. If several EUV radiation sources are provided, a path of the EUV radiation transferred using the EUV collector may run from one of these EUV radiation sources through another one of the EUV radiation sources. If several EUV radiation sources are provided, the illumination system according to the disclosure may be operated in such a way that only one of the EUV radiation sources is active in each case.

The efficient collection of the emission of the EUV radiation source ensures that, for a given radiation source, a higher useful light energy is available for projection exposure. Vice versa, a given useful light energy can be achieved with a smaller EUV radiation source. This increases either the throughput for projection exposure or the costs for providing the EUV radiation source.

BRIEF DESCRIPTION OF THE DRAWINGS

Exemplary embodiments of the disclosure will hereinafter be explained in more detail by the drawings, in which.

DETAILED DESCRIPTION

Figure 1:
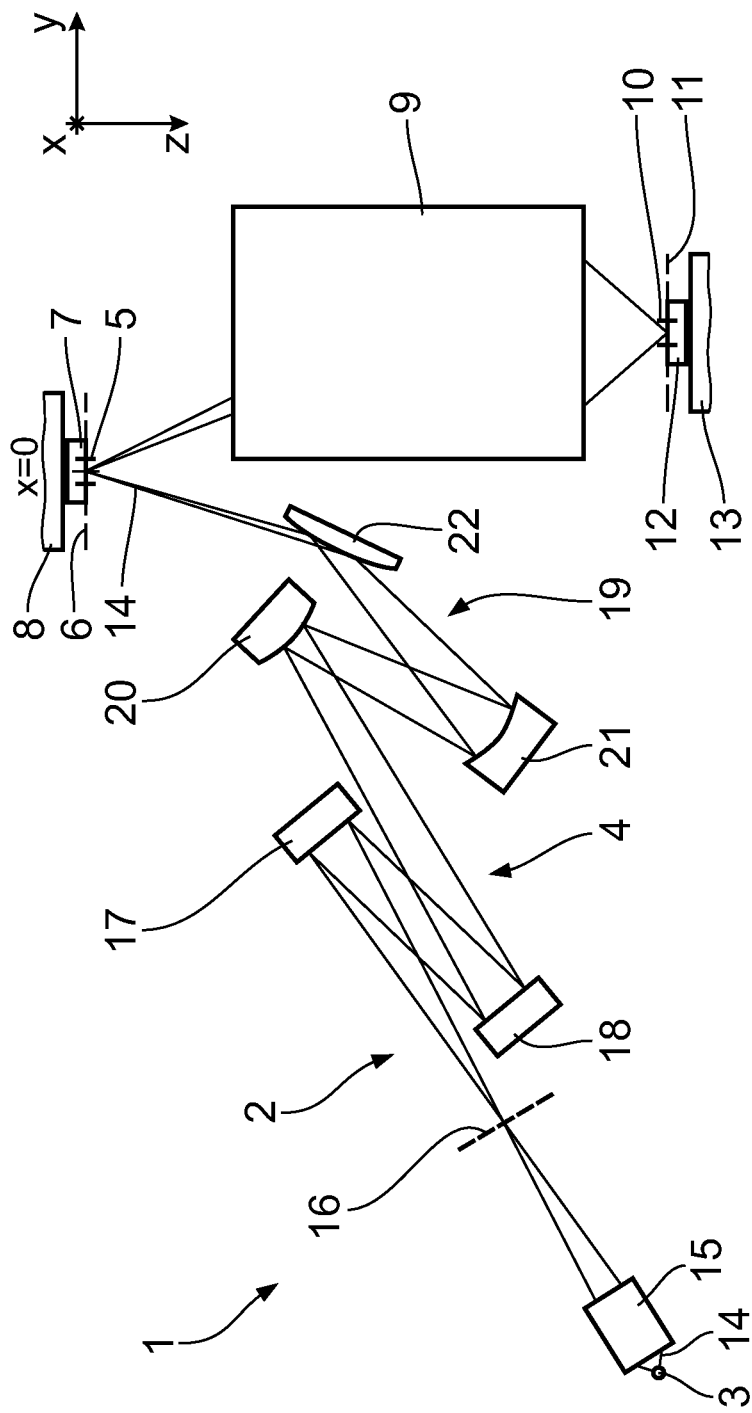
FIG. 1 shows a diagrammatic meridional section through a projection exposure apparatus for EUV projection lithography.

FIG. 1 shows a diagrammatic meridional section through a projection exposure apparatus 1 for microlithography. In addition to a radiation source 3, an illumination system 2 of the projection exposure apparatus 1 has an illumination optics 4 for illuminating an object field 5 in an object plane 6. In this process, a reticle 7 is illuminated which is arranged in the object field 5 and which is held in place by a reticle holder 8 which is only partially shown. A projection optics 9 images the object field 5 into an image field 10 in an image plane 11. In this process, a structure on the reticle 7 is imaged to a light-sensitive layer of a wafer 12 arranged in the region of the image field 10 in the image plane 11, the wafer 12 also being held in place by a wafer holder 13 which is only diagrammatically shown as well.

The radiation source 3 is an EUV radiation source with an emitted useful radiation in the range between 5 nm and 30 nm. The EUV radiation source may be a plasma source, in particular an LPP source (laser produced plasma). The EUV radiation source may for example also be a GDPP source (gas discharge produced plasma). A synchrotron-based radiation source may be a suitable radiation source 3 as well. Information concerning a radiation source of this type is provided to those skilled in the art by U.S. Pat. No. 6,859,515 B2, for example. EUV radiation 14 emitted by the radiation source 3 is bundled by a collector 15. The collector 15 is shown in more detail in FIG. 2 which will be described below. Downstream of the collector 15, the EUV radiation 14 propagates through an intermediate focal plane 16 before impinging upon a field facet mirror 17. The field facet mirror 17 is arranged in a plane of the illumination optics 4 which is optically conjugate with the object plane 6.

The EUV radiation 14 is hereinafter also referred to as illumination light or imaging light.

Downstream of the field facet mirror 17, the EUV radiation 14 is reflected by a pupil facet mirror 18. The pupil facet mirror 18 is arranged in a pupil plane of the illumination optics 4 which is optically conjugate with a pupil plane of the projection optics 9. Via the pupil facet mirror 18 and an imaging optical assembly in the form of a transfer optics 19 including mirrors 20, 21 and 22 which are numbered in the order in which they are arranged in the beam path, field facets of the field facet mirror 17, which will be described in more detail below, are imaged into the object field 5. The last mirror 22 of the transfer optics 19 is a grazing incidence mirror. The pupil facet mirror 18 and the transfer optics 19 form a following optics for transferring the illumination light 14 to the object field 5. The transfer optics 19 may be dispensed with in particular if the pupil facet mirror 18 is arranged in an entrance pupil of the projection optics 9.

In order to facilitate the description of positional relationships, FIG. 1 is provided with a Cartesian coordinate system serving as a global coordinate system for describing the positional relationships of components of the projection exposure apparatus 1 between the object plane 6 and the image plane 11. In FIG. 1, the x-axis runs into the drawing plane in a direction perpendicular thereto. The y-axis runs to the right in FIG. 1. The z-axis runs downward in FIG. 1, in other words perpendicular to the object plane 6 and to the image plane 11.

The reticle holder 8 and the wafer holder 13 are both actuable for displacement in such a way that the reticle 7 and the wafer 12 are scanned in a displacement direction, namely the y-direction, by the object field 5 on the one hand and by the image field 10 on the other during projection exposure. The displacement direction y is hereinafter also referred to as scanning direction.

The collector 15 is hereinafter explained in more detail via FIG. 2. The collector 15 transfers the EUV radiation 14, in other words a non-directional emission of the EUV radiation source 3, to a main intensity spot in the intermediate focal plane 16, in other words to an intermediate focus 23.

The collector 15 has a collector subunit 24 including a total of four grazing incidence mirrors $25_1$ to $25_4$. An angle of incidence of the EUV radiation to the mirrors $25_1$ to $25_4$ is thus above a critical grazing incidence angle. This critical grazing incidence angle is 70°.

The collector subunit 24 transfers a portion of the total EUV radiation 15 emitted by the radiation source 3 to the intermediate focus 23. In this process, the collector subunit 24 collects a solid angle of the emission of the radiation source 3 in the forward direction. Seen from the radiation source 3, the forward direction is a direction of emission into a half space where the intermediate focus 23 is located as well.

Figure 2:
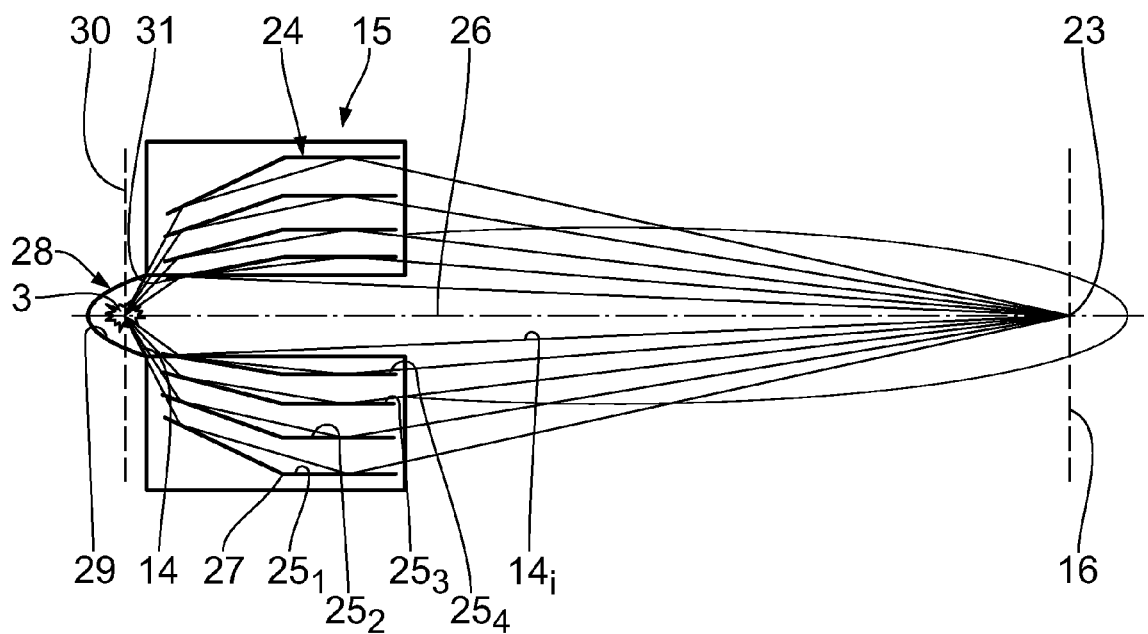
FIGS. 2 to 7 show meridional sections of embodiments of collectors for transferring an emission of a non-directional EUV radiation source of the projection exposure apparatus according to FIG. 1 to a main intensity spot arranged at the position of an intermediate focus.

The mirrors $25_1$ to $25_4$ are mirror shells which are arranged one inside the other and are numbered from the outside to the inside in FIG. 2. Alternatively, the collector subunit 24 may also include a different number of mirrors 25, for instance one mirror shell, two mirror shells or more than two mirrors shells which are arranged one inside the other, for example three, four, five or even more mirror shells which are arranged one inside the other. Reflection surfaces of the mirrors $25_1$ to $25_4$ are the inner walls of the respective mirror shell.

The mirrors $25_1$ to $25_4$ are rotationally symmetric about a central axis 26 on which the radiation source 3 is arranged as well. In the meridional section shown in FIG. 2, each of the mirrors $25_1$ to $25_4$ has a bent region 27 which surrounds the axis 26. EUV radiation 14 which is reflected by the mirrors $25_1$ to $25_4$ in a grazing manner is in each case reflected by the mirrors $25_1$ to $25_4$ twice, namely upstream of the bent region 27 and downstream of the bent region 27, as shown for selected beam paths of the EUV radiation 14 in FIG. 2.

A collector in the manner of the collector subunit 24 is disclosed in WO 2009/095220 A2. The collector subunit 24 may be designed in the manner of a collector of the type Wolter-I and may consist of a combination of a hyperboloid and an ellipsoid. More detailed information concerning these collectors can be found in the publications of H. Wolter "Spiegelsysteme streifenden Einfalls als abbildende Optiken für Röntgenstrahlen" and "Verallgemeinerte Schwarzschildsche Spiegelsysteme streifender Reflexion als Optiken für Röntgenstrahlen", Annalen der Physik, vol. 10, p. 94-114 and 286-295, 1952, and on the internet on page http://www.x-rayoptics.de (see keywords "Types of Optics", "Reflecting optics" and "Curved mirrors").

In addition to the collector subunit 24, the collector 15 according to FIG. 2 has an ellipsoid mirror 28 with an ellipsoidal mirror surface 29.

The radiation source 3 is arranged in one intensity spot of the elliptical mirror surface 29 while the intermediate focus 23 is arranged in the other intensity spot of the elliptical mirror surface 29. An external diameter of the mirror surface 29 which is usable for reflecting the EUV radiation 14 has approximately the same size as an internal diameter of the mirror shell of the innermost mirror $25_4$ of the collector subunit 24. The edge region of the mirror surface 29 adjacent to this external diameter is arranged in close proximity to this mirror $25_4$. The ellipsoid mirror 28 receives the entire EUV radiation 14 which is emitted backwards to the radiation source 3, in other words the radiation which is emitted from the radiation source 3 into the half space where the intermediate focus 23 is not located. Also, the ellipsoid mirror 28 reflects a portion of the EUV radiation 14 emitted in the forward direction.

The two half spaces which define the forward direction and the backward direction are separated from each other by a plane 30 to which the rotational symmetry axis 26 is perpendicular and in which the radiation source 3 is located.

The mirror surface 29 is impinged by the EUV radiation 14 at an angle of incidence which is below the critical grazing incidence angle. As is common practice in optics, the angle of incidence is defined as the angle between a normal to a reflection plane and the incident radiation.

The collector 15 has exactly one collector subunit 24, in other words no other collector subunits including at least one grazing incidence mirror. With respect to a grazing incidence of the EUV radiation 14, only the collector subunit 24 is arranged in the beam path of a respective emitted EUV partial beam of the EUV radiation 14 between the EUV radiation source 3 and the intermediate focus 23. In other words, apart from the collector subunit 24 including the grazing incidence mirrors 25, there is no other collector subunit including grazing incidence mirrors which guides those partial beams of the EUV radiation 14 which have already been guided by the collector subunit 24.

In an embodiment of a collector (not shown) which includes a downstream illumination optics and which may alternatively be provided in the projection exposure apparatus, there is a relay optics between a transfer or intermediate intensity spot of the collector 15 to which the EUV radiation 14 is transferred by the collector subunit 24 and the ellipsoid mirror 28 and the intermediate focus 23 in the intermediate focal plane 16, which relay optics transfers the intensity spot to the intermediate focus 23. In this case, which is not shown in FIG. 2, the transfer intensity spot does not coincide with the intermediate focus 23, in other words the main intensity spot. In the case according to FIG. 2 on the other hand, the transfer intensity spot coincides with the main intensity spot.

The EUV radiation 14, which is reflected by the ellipsoid mirror 28, is guided to the intermediate focus 23 via a through-opening 31 in the innermost mirror $25_4$ of the collector subunit 24.

Figure 3:
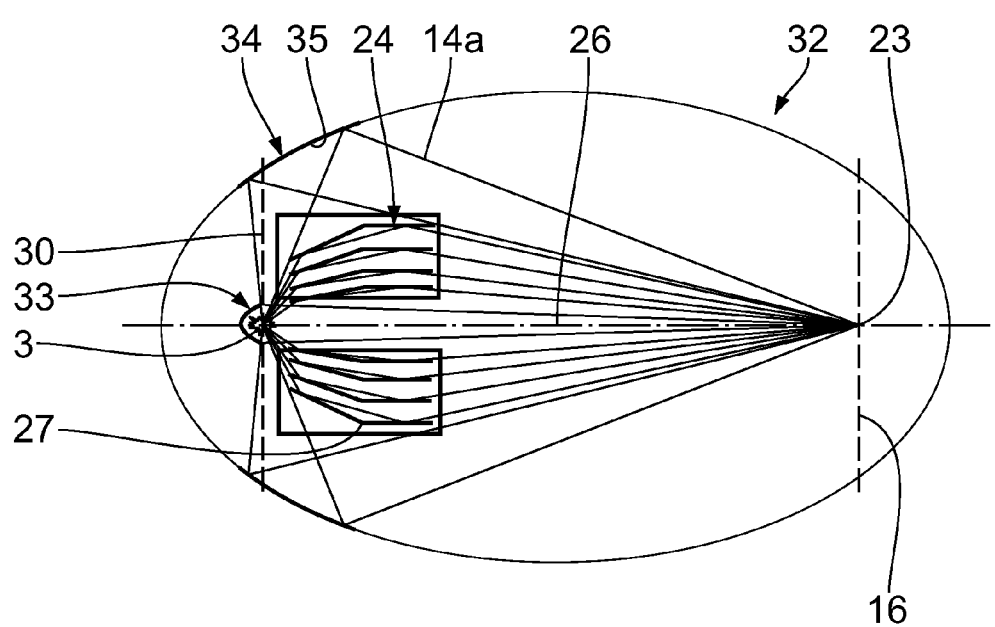

The following is a description, via FIG. 3, of another embodiment of the collector 32 which may be employed in the projection exposure apparatus 1 according to FIG. 1 instead of the collector 15. Components which correspond to those that have already been described above with reference to FIGS. 1 and 2 have the same reference numerals and are not discussed in detail again.

In the embodiment according to FIG. 3, an ellipsoid mirror 33, which otherwise corresponds to the ellipsoid mirror 28 of the embodiment according to FIG. 2, is designed so that it collects virtually the entire EUV radiation 14 of the radiation source 3 emitted in the backward direction. Between the solid angle collection regions of the ellipsoid mirror 33 on the one hand and the collector subunit 24 on the other, there is a ring of solid angles which surrounds the symmetry axis 26 and includes directions which are in close proximity to the plane 30 for separating the half planes. These solid angles are collected in the collector 32 by another ellipsoid mirror 34 having a mirror surface 35. Likewise, the elliptic shape of the mirror surface 35 is such that the radiation source 3 is disposed in one intensity spot while the intermediate focus 23 is disposed in the other intensity spot of the mirror surface 35. The ellipsoid mirror 34 has the shape of a ring-shaped mirror shell whose inner wall, which defines the mirror surface 35, reflects the EUV radiation 14. This mirror shell is arranged around the axis 26 in a rotationally symmetric manner.

An internal diameter of a useful region of the mirror surface 35 is greater than an external diameter of a useful region of the outermost mirror $25_1$ of the collector subunit 24. The EUV radiation $14_a$ which is reflected by the ellipsoid mirror 34 is guided to the intermediate focus 23 via a spatial region which is arranged around the collector subunit 24.

Figure 4:
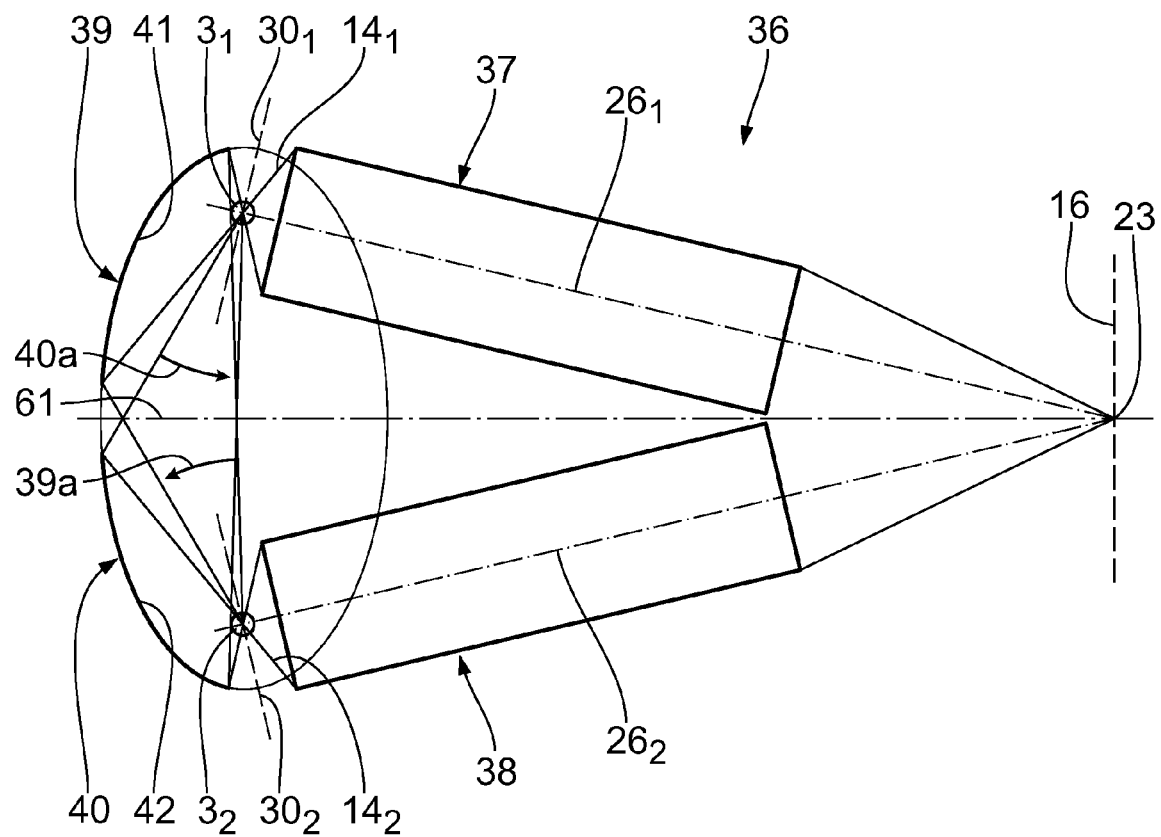

The following is a description, with reference to FIG. 4, of another embodiment of a collector 36 which may be provided in the projection exposure apparatus 1 if the projection exposure apparatus 1 is equipped with two spaced EUV radiation sources $3_1$ and $3_2$. Components which correspond to those that have already been described above have the same reference numerals and are not discussed in detail again.

The collector 36 has two collector subunits 37, 38. Each of these two collector subunits 37, 38 is assigned to one of the two radiation sources $3_1$, $3_2$. Each of the collector subunits 37, 38 has several mirrors in the form of mirror shells which are arranged one inside the other in the manner of the mirrors $25_1$ to $25_4$ of the embodiments according to FIGS. 2 and 3. This is not shown in FIG. 4. The mirror shells of the collector subunits 37, 38 are rotationally symmetric to symmetry axes $26_1$, $26_2$ which in each case coincide with connection lines between the radiation sources $3_1$, $3_2$ and the intermediate focus 23. The two collector subunits 37, 38 are thus not mirror symmetric relative to the same symmetry axis. The collector subunits 37, 38 may in each case be designed in the manner of the collector subunit 24 of the FIGS. 2 and 3.

The collector subunits 37, 38 collect EUV radiation $14_1$, $14_2$ which is in each case emitted in the forward direction by one of the radiation sources $3_1$, $3_2$. Half space separation planes $30_1$, $30_2$ for distinguishing the forward direction of the emission of the radiation source $3_1$, $3_2$ from the backward direction thereof are in each case defined as the planes in which the radiation sources $3_1$, $3_2$ are disposed and to which the symmetry axes $26_1$, $26_2$ are perpendicular. EUV radiation which is emitted in directions which coincide at least partially with the half space separation planes $30_1$, $30_2$ is hereinafter referred to as emission in a lateral direction.

In addition to the two collector subunits 37, 38, the collector 36 has two ellipsoid mirrors 39, 40. The ellipsoid mirror 40 which is adjacent to the radiation source $3_2$ receives EUV radiation $14_1$ emitted by the radiation source $3_1$ in the lateral direction. The ellipsoid mirror 39 which is adjacent to the radiation source $3_1$ receives EUV radiation $14_2$ emitted by the radiation source $3_2$ in the lateral direction. Solid angle regions 39a, 40a of EUV radiation, which is emitted by the light sources $3_1$, $3_2$ and which is also usable by the collector 36, are highlighted in FIG. 4. Mirror surfaces 41, 42 of the two ellipsoid mirrors 39, 40 are disposed on one and the same ellipsoid, with the two radiation sources $3_1$, $3_2$ being disposed in the two intensity spots thereof. Each of the two mirror surfaces 41, 42 forms a portion of this ellipsoid. The mirror surfaces 41, 42 are concave inner wall portions of the ellipsoid mirrors 39, 40.

EUV radiation $14_1$ which is emitted by the radiation source $3_1$ in the lateral direction and which is reflected by the mirror surface 42 of the ellipsoid mirror 40 is then guided to the location of the second radiation source $3_2$, passes through this second radiation source $3_2$ and is then received by the collector subunit 38 and guided to the intermediate focus 23. A solid angle of collection 40a of the collector subunit 38 is adapted to the mirror surface 42 of the ellipsoid mirror 40 in such a way that the radiation reflected by the mirror surface 42 can be collected by the collector subunit 38 after passing the location of the radiation source $3_2$.

Correspondingly, the EUV radiation $14_2$ which is emitted by the radiation source $3_2$ in the lateral direction is reflected by the mirror surface 41 of the ellipsoid mirror 39 before passing through the location of the other radiation source $3_1$ and is then collected by the collector subunit 37, whose solid angle of collection is adapted to the surface of the mirror surface 41, before being guided to the intermediate focus 23.

In the operation of the projection exposure apparatus 1 including the collector 36, the two plasma radiation sources $3_1$, $3_2$ are ignited at different times so that when one of the two radiation sources $3_1$, $3_2$ is emitting radiation, the other one of the two radiation sources $3_1$, $3_2$ is not active. This prevents unwanted absorption of EUV radiation $14_2$, $14_1$, which is emitted by the respective active radiation source $3_1$, $3_2$ in the backward direction and which is reflected by the mirror surfaces 42, 41 towards the location of the other radiation source, by plasma of this other radiation source $3_2$, $3_1$.

Figure 5:
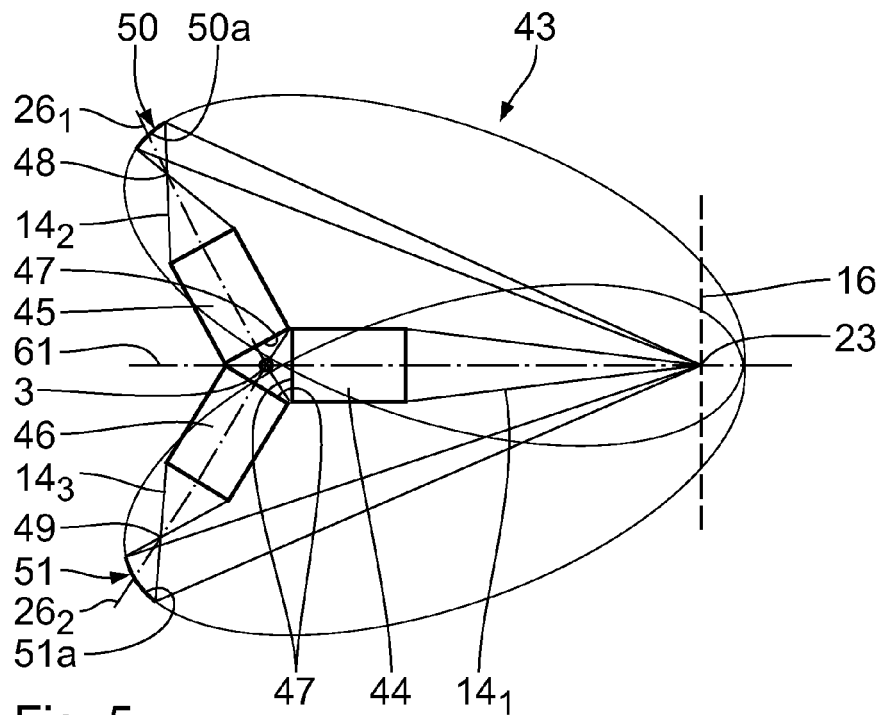

The following is a description, with reference to FIG. 5, of another embodiment of a collector 43 to be used in the projection exposure apparatus according to FIG. 1 instead of the collector 15. Components which correspond to those which have already been described above with reference to FIGS. 1 to 4 have the same reference numerals and are not discussed in detail again.

The collector 43 is again designed for operation with exactly one EUV radiation source 3. The radiation source 3 according to FIG. 5 is again surrounded by three collector subunits 44, 45 and 46 which are again shown in a diagrammatic meridional section in FIG. 5. Outside the drawing plane of FIG. 5, for example two further collector subunits of this type may be arranged which are able to collect portions of the EUV radiation 14 which are emitted by the radiation source 3 in the direction of the observer and in the opposite direction.

It is generally possible for collector subunits to not only be arranged within the drawing plane of FIG. 5 but also around the radiation source 3, for example in the shape of a regular polyhedron (so-called Platonic bodies), an irregular polyhedron (so-called Archimedic bodies) or any other spatial arrangement. Each of these arrangements may also have intermediate regions which are suitable for the supply of a plasma-producing laser radiation or which may serve as installation spaces for retaining devices.

The collector subunit 44 is arranged similarly to the collector unit 24 of the embodiments according to FIGS. 2 and 3 and collects, in the meridional plane according to FIG. 5, approximately one third of the reflection angle emitted by the radiation source 3. The two other thirds of the reflection angle of the radiation source 3 in the meridional plane according to FIG. 5 are collected by the other two collector subunits 45, 46 so that in the meridional plane according to FIG. 5, entrance front regions 47 of the three collector subunits 44 to 46 surround the radiation source 3 in the manner of an equilateral triangle.

Having been collected by the collector subunit 44, the EUV radiation 14 of the radiation source 3 is directly transferred to the intermediate focus 23 as explained above with reference to the descriptions according to FIGS. 2 to 4.

The other two collector subunits 45, 46 transfer the collected EUV radiation $14_2$, $14_3$ to an intermediate intensity spot 48, 49 in each case downstream of the collector subunit 45, 46. Each of the collector subunits 44 to 46 is rotationally symmetric. The collector subunit 44 is rotationally symmetric about a symmetry axis which coincides with the intersection of the symmetry plane 61 with the drawing plane. The two collector subunits 45, 46 are in each case rotationally symmetric about symmetry axes $26_1$, $26_2$. The symmetry axes around which the collector subunits 44 to 46 are arranged in a rotationally symmetric manner do not coincide with each other.

An ellipsoid mirror 50, 51 including mirror surfaces 50a, 51a is in each case arranged in the beam path of the EUV radiation $14_2$, $14_3$ downstream of the collector subunits 45, 46. The intermediate intensity spot 48 at the exit of the collector subunit 45 is arranged in an intensity spot of the ellipsoid defined by the mirror surface 50a of the ellipsoid mirror 50. The intermediate focus 23 is disposed in the other intensity spot of the ellipsoid. The intermediate intensity spot 49 at the exit of the collector subunit 46 is arranged in an intensity spot of the ellipsoid defined by the mirror surface 51a of the ellipsoid mirror 51. The intermediate focus 23 is disposed in the other intensity spot of the ellipsoid.

Ellipsoid mirrors which are shaped and arranged correspondingly are assigned to further collector subunits which may additionally be provided and which collect the emission of the radiation source 3 from directions which are perpendicular to the drawing plane according to FIG. 5, for example.

In an alternative embodiment of the collector 43 according to FIG. 5, the collector subunit 44 may also be omitted.

Figure 6:
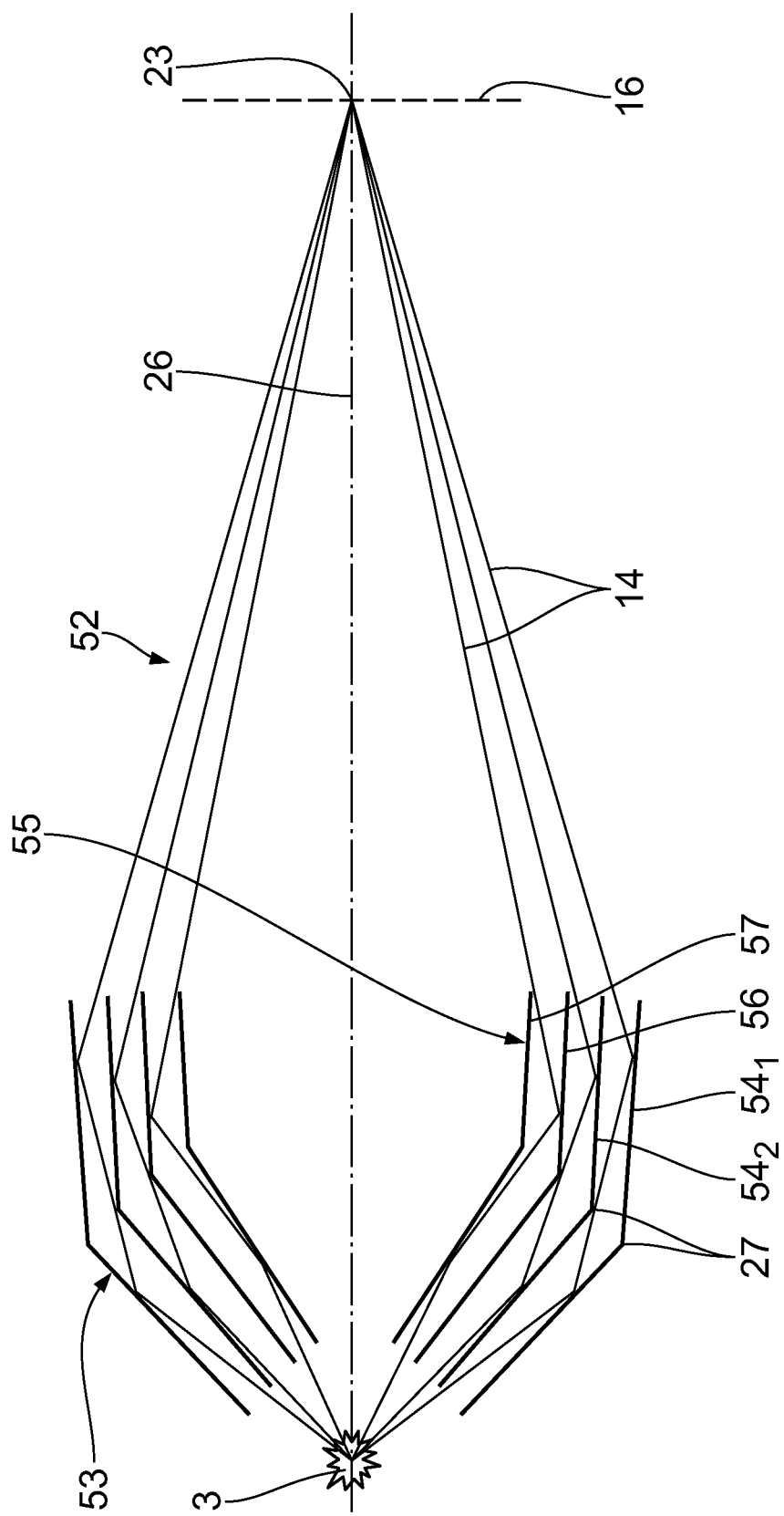

The following is a description, via FIG. 6, of another embodiment of a collector 52 to be used in the projection exposure apparatus 1 according to FIG. 1 instead of the collector 15. Components which correspond to those which have already been described above with reference to FIGS. 1 and 5 have the same reference numerals and are not discussed in detail again.

The collector 52 has a collector subunit 53 including a total of two grazing incidence mirrors $54_1$ and $54_2$. These mirrors $54_1$ and $54_2$ are mirror shells which are disposed one inside the other and are rotationally symmetric about the central rotational symmetry axis 26. The collector 52 additionally has another collector unit 55 including two grazing incidence mirrors 56, 57. The mirror 56 is another mirror shell which is arranged within the innermost mirror $54_2$ of the collector subunit 53 and which is also rotationally symmetric to the central symmetry axis 26. The mirror 57 is another mirror shell which is arranged in the mirror 56. Thus, the collector 52 has a total of four mirrors, namely the two outer mirrors $54_1$ and $54_2$ of the collector subunit 53 and the two inner mirrors 56, 57 of the collector subunit 55.

In the case of grazing incidence, the mirrors $54_1$ and $54_2$ of the collector subunit 53 are used like the mirrors $25_1$ to $25_4$ of the embodiment according to FIGS. 2 and 3. The EUV radiation 14 is reflected by the mirrors $54_1$ and $54_2$, in other words by their mirror shell inner walls. The mirror shell inner walls are those walls of the mirror shells which face the central rotational symmetry axis 26. Correspondingly the outer walls of the mirror shells are those walls which are arranged in such a way as to face away from the central rotational symmetry axis 26.

The two inner mirror shells, in other words the mirrors 56 and 57 forming the collector subunit 55, are designed in such a way that EUV radiation 14 which is emitted by the radiation source 3 to enter the region between these two mirrors 56, 57 is at first reflected by an outer wall of the innermost mirror shell, in other words the mirror 57, before being reflected, downstream of the bending region 27 of the mirrors 56, 57, by a mirror shell inner wall of the mirror 56 of the collector subunit 55 surrounding the innermost mirror 57. The inner collector subunit 55 is therefore a Wolter-II collector.

The collector 52 may additionally include an ellipsoid mirror in the manner of the ellipsoid mirrors 28 or 33, 34. Furthermore, the collector 52 may be part of one of the collector systems according to FIGS. 4 and 5 where it fulfils the function of the collector subunit 37, 38 and 44 to 46, for example.

Figure 7:
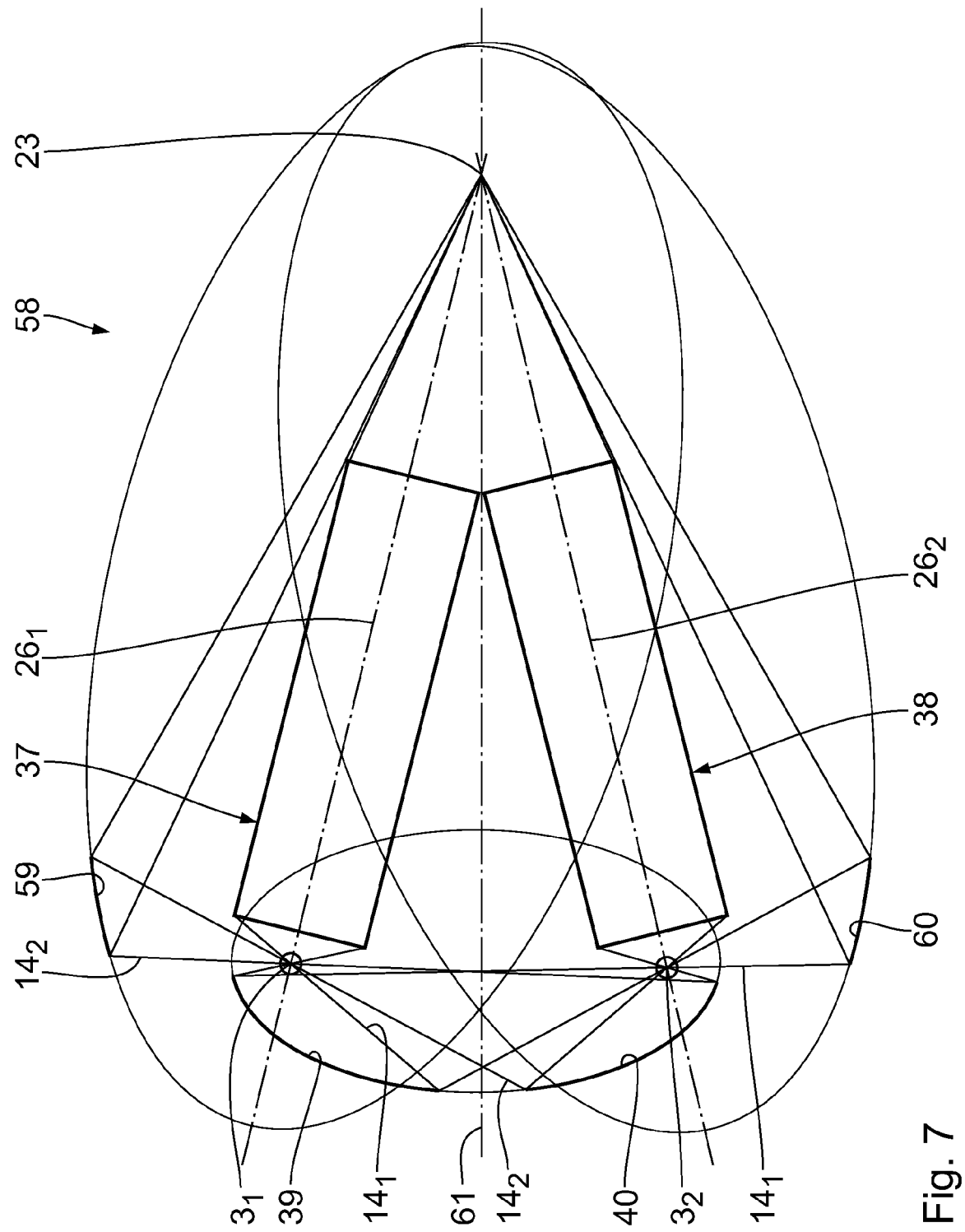

The following is a description, via FIG. 7, of a collector 58 which, similarly to the collector 36 according to FIG. 4, may also be used in the projection exposure apparatus 1 if the projection exposure apparatus 1 is equipped with two spaced EUV radiation sources $3_1$ and $3_2$. Components which correspond to those that have already been described above with reference to FIGS. 1 to 6 and in particular with reference to FIG. 4 have the same reference numerals and are not discussed in detail again.

In addition to the mirrors and collectors of the collector 38, the collector 58 is also equipped with two further shell-like ellipsoid mirrors 59, 60 whose function is similar to that of the ellipsoid mirror 34 of the collector 32 according to FIG. 2. The ellipsoid mirror 59 is a partial ring shell, for example a half shell, with the radiation source $3_1$ being disposed in one intensity spot while the intermediate focus 23 is disposed in the other intensity spot of the mirror 59. The radiation source $3_2$ is disposed in one of the two intensity spots of the ellipse of the mirror 60 while the intermediate focus 23 is disposed in the other intensity spot.

The mirror 60 is mirror symmetric to the mirror 59 relative to a symmetry plane 61. The symmetry plane 61 which includes the angle bisector between the two symmetry axes $26_1$, $26_2$ and is perpendicular to the drawing plane of FIG. 7, is a mirror symmetry plane for all bundle-guiding components of the collector 58. A corresponding symmetry plane is provided in the collector 36 according to FIG. 4 as well.

The mirror 59 receives EUV radiation $14_2$ of the radiation source $3_2$ which is emitted in the backward direction and was at first reflected by the ellipsoid mirror 40. The mirror 59 guides this EUV radiation $14_2$ past the outside of the collector subunit 37 and in the direction of the intermediate focus 23.

Similarly, EUV radiation $14_1$ which is emitted by the radiation source $3_1$ in the backward direction is at first reflected by the ellipsoid mirror 39 and then by the mirror 60 before being reflected past the outside of the collector subunit 38 in the direction of the common intermediate focus 23.

Similarly to the above explanation with reference to the collector 36 according to FIG. 4, the EUV beam paths $14_2$ and $14_1$ pass through the respective other EUV radiation sources $3_1$ and $3_2$, which are not in operation at this instant, before being reflected by the mirrors 50, 60.

Similarly to the above explanation with reference to the mirror 34 in FIG. 3, the mirror 59 furthermore reflects the light, which is emitted by the radiation source $3_1$ in the lateral direction, towards the intermediate focus 23.

The mirror 60 also reflects the light emitted by the radiation source $3_2$ in the lateral direction directly towards the intermediate focus 23 as well.

To conclude, this arrangement allows the light, which is emitted by the light sources $3_1$ and $3_2$ in the forward and backward directions as well as two different lateral directions, to be collected in a common intensity spot.

When the projection exposure apparatus 1 is operated with one of the collector embodiments described above, the reticle 7 and the wafer 12, which is provided with a coating that is light-sensitive to the illumination light 14, are provided in a first step; then at least a portion of the reticle 7 is projected to the wafer 12 via the projection exposure apparatus 1. Having been exposed to the illumination light bundle 14, the light-sensitive layer on the wafer 12 is developed so as to produce the microstructured or nanostructured component, for example a semiconductor chip.

What is claimed is:

1. An EUV collector configured to transfer an emission of at least one EUV radiation source to a main intensity spot, the EUV collector comprising:

a collector subunit comprising first and second grazing incidence mirrors arranged one behind the other, the first and second grazing incidence mirrors being configured to transfer EUV radiation from the radiation source to a transfer intensity spot; and an ellipsoid mirror having an ellipsoidal mirror surface configured so that, during use of the EUV collector, the EUV radiation impinges on the ellipsoidal mirror surface at an angle of incidence below a critical grazing incidence angle, wherein:
the EUV collector has no more than one collector subunit comprising any grazing incidence mirrors in a path of an EUV partial beam between the EUV radiation source and the transfer intensity spot;
EUV partial beams are emitted by the EUV radiation source so that each EUV partial beam is reflected by no more than one single collector subunit comprising at least one grazing incidence mirror;
at least some of the EUV partial beams emitted by the EUV radiation source are reflected only by the collector subunit comprising the first and second grazing incidence mirrors;
the collector subunit is configured to collect a forward emission portion of the emission of the at least one EUV radiation source which is emitted toward the main intensity spot; and
the ellipsoid mirror is configured to collect a backward emission portion of the emission of the at least one EUV radiation source which is emitted away from the main intensity spot.

2. The collector of claim 1, wherein the collector comprises exactly one collector subunit which comprises at least one grazing incidence mirror.

3. The collector of claim 1, wherein the collector comprises exactly two collector subunits which comprise at least one grazing incidence mirror.

4. The collector of claim 1, wherein the collector subunit comprising the first and second grazing incidence mirrors is configured to transfer the EUV radiation from the radiation source to an intermediate intensity spot.

5. The collector of claim 4, comprising a plurality of collector subunits is arrangeable around the EUV radiation source, each of the plurality of collector subunits comprises at least one grazing incidence mirror.

6. The collector of claim 1, wherein the collector comprises exactly one collector subunit which comprises at least one grazing incidence mirror and an ellipsoid mirror in the path of the EUV partial beam emitted by the radiation source between the EUV radiation source and the main intensity spot.

7. The collector of claim 1, wherein the collector is arranged so that EUV radiation reflected by the ellipsoid mirror is guided directly to the main intensity spot via a through-opening in the collector subunit comprising the first and second grazing incidence mirrors.

8. The collector of claim 1, wherein the collector is arranged so that EUV radiation reflected by the ellipsoid mirror is guided directly to the main intensity spot via a spatial region which is around the collector subunit comprising the first and second grazing incidence mirrors.

9. An illumination optics, comprising:
a collector according to claim 1 configured to illuminate an object field which is imageable by an imaging optics.

10. An illumination system, comprising:
at least one EUV radiation source; and
an illumination optics comprising a collector according to claim 1 configured to illuminate an object field which is imageable by an imaging optics.

11. The illumination system of claim 10, comprising a plurality of EUV radiation source.

12. An apparatus, comprising:
an illumination system comprising a collector according to claim 1;
an imaging optics configured to image an object field into an image field,
wherein the illumination optics is configured to illuminate the object field of the imaging optics, and the apparatus is a projection exposure apparatus.

13. The apparatus of claim 12, further comprising at least one EUV radiation source.

14. The apparatus of claim 12, wherein the collector comprises exactly one collector subunit which comprises at least one grazing incidence mirror.

15. A method of using a projection exposure apparatus comprising an illumination system and an imaging optics, the method comprising:
using the illumination system to illuminate a reticle with EUV radiation; and
using the imaging optics to project at least a portion of the reticle onto a material which is sensitive to the EUV radiation,
wherein the illumination system comprises a collector according to claim 1.

16. A collector, comprising:
a plurality of ellipsoid mirrors comprising a first ellipsoid mirror and a second ellipsoid mirror,
wherein:
the collector is configured to transfer emission of EUV radiation from a plurality of EUV radiation sources to a single main intensity spot; and
the radiation sources are disposed at both ellipse focus points of at least one of the ellipsoid mirrors.

17. The collector of claim 16, further comprising:
a collector subunit comprising first and second grazing incidence mirrors arranged one behind the other, the first and second grazing incidence mirrors being configured to transfer EUV radiation from the radiation source to a transfer intensity spot,
wherein:
the first ellipsoidal mirror surface is configured so that, during use of the EUV collector, the EUV radiation impinges on the first ellipsoidal mirror surface at an angle of incidence below a critical grazing incidence angle,
EUV partial beams are emitted by a first EUV radiation source of the plurality of EUV radiation sources so that each EUV partial beam is reflected by no more than one single collector subunit comprising at least one grazing incidence mirror; and
at least some of the EUV partial beams emitted by the first EUV radiation source are reflected only by the collector subunit comprising the first and second grazing incidence mirrors.

18. The collector of claim 17, wherein the collector comprises exactly one collector subunit which comprises at least one grazing incidence mirror.

19. The collector of claim 17, wherein the collector comprises exactly two collector subunits which comprise at least one grazing incidence mirror.

* * * * *